(12) United States Patent
Wang et al.

(10) Patent No.: US 7,579,646 B2
(45) Date of Patent: Aug. 25, 2009

(54) FLASH MEMORY WITH DEEP QUANTUM WELL AND HIGH-K DIELECTRIC

(75) Inventors: Ming-Tsong Wang, Taipei (TW);
Tong-Chern Ong, Taipei (TW); Albert Chin, Hsinchu (TW); Chun-Hung Lai, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 15 days.

(21) Appl. No.: 11/440,667

(22) Filed: May 25, 2006

(65) Prior Publication Data

US 2007/0272916 A1     Nov. 29, 2007

(51) Int. Cl.
*H01L 29/08* (2006.01)

(52) U.S. Cl. .............................. 257/314; 257/24; 257/25

(58) Field of Classification Search ................. 257/24, 257/25, 26, 27, 315, 314, 321, 324, E29.17, 257/325, 411
See application file for complete search history.

(56) References Cited

U.S. PATENT DOCUMENTS

| | | | |
|---|---|---|---|
| 5,596,214 A | 1/1997 | Endo | |
| 6,031,263 A | 2/2000 | Forbes et al. | |
| 6,709,928 B1 | 3/2004 | Jenne et al. | |
| 6,933,218 B1 | 8/2005 | Lee et al. | |
| 6,958,513 B2 | 10/2005 | Wang | |
| 7,112,539 B2 | 9/2006 | Lee et al. | |
| 7,372,098 B2* | 5/2008 | Forbes .................... | 257/316 |
| 2002/0106536 A1 | 8/2002 | Lee et al. | |
| 2004/0004247 A1* | 1/2004 | Forbes et al. ............ | 257/324 |
| 2004/0224459 A1* | 11/2004 | Nishikawa ................ | 438/202 |
| 2004/0248371 A1 | 12/2004 | Wang | |
| 2005/0153571 A1 | 7/2005 | Senzaki | |
| 2005/0205969 A1* | 9/2005 | Ono et al. ................ | 257/645 |
| 2006/0044915 A1 | 3/2006 | Park et al. | |
| 2006/0097306 A1 | 5/2006 | Kim et al. | |
| 2006/0261401 A1* | 11/2006 | Bhattacharyya ........... | 257/316 |
| 2006/0273370 A1* | 12/2006 | Forbes .................... | 257/302 |
| 2007/0132010 A1 | 6/2007 | Bhattacharyya | |
| 2007/0187730 A1 | 8/2007 | Park et al. | |

OTHER PUBLICATIONS

Goano, M. et al., "Band structure nonlocal pseudopotential calculation of teh III-nitride wurtzite pahse materials system. Part II, Ternary alloys AlxGa1-xN, InxGa1-xN, and InxAl1-xN," Journal of Applied Physics, vol. 88, No. 11, Dec. 2000.*

(Continued)

*Primary Examiner*—Zandra V. Smith
*Assistant Examiner*—Paul E Patton
(74) *Attorney, Agent, or Firm*—Slater & Matsil, L.L.P.

(57) ABSTRACT

A flash memory cell includes a substrate and a gate structure formed on the substrate. The gate structure includes a tunneling layer over the substrate, a storage layer over the tunneling layer, a blocking layer over the storage layer, and a gate electrode over the dielectric. The storage layer preferably has a conduction band lower than a conduction band of silicon. The blocking layer is preferably formed of a high-k dielectric material.

13 Claims, 5 Drawing Sheets

OTHER PUBLICATIONS

Eitan, B., et al., "4-bit per Cell NROM Reliability," IEEE, 2005, pp. 539-542.

Green, M. L., et al., "Ultrathin (<4 nm) $SiO_2$ and Si-O-N gate dielectric layers for silicon microelectonics: Understanding the processing, structure, and physical and electrical limits," Journal of Applied Physics, vol. 90, No. 5, Sep. 1, 2001, 2001 American Institute of Physics, pp. 2057-2121.

Shappir, A., et al., "NROM Window Sensing for 2 and 4-bits per cell Products," IEEE, 2006, pp. 68-69.

Yokoyama, S., et al., "Characterization of plasma-enhanced chemically-vapor-deposited silicon-rich silicon dioxide/thermal silicon dioxide dual dielectric systems," Journal of Applied Physics, vol. 54, No. 12, Dec. 1983, 1983 American Instituted of Physics, pp. 7058-7065.

* cited by examiner

FLASH MEMORY WITH DEEP QUANTUM WELL AND HIGH-K DIELECTRIC

TECHNICAL FIELD

This invention relates generally to semiconductor devices, and more particularly to the structure and manufacturing methods of flash memory cells.

BACKGROUND

Flash memory has become increasingly popular in recent years. A typical flash memory comprises a memory array having a large number of memory cells arranged in blocks. One of the most commonly known flash memories is the one-transistor flash memory, wherein each of the memory cells is fabricated as a field-effect transistor having a control gate and a floating gate. The floating gate is capable of holding charges and is separated from source and drain regions contained in a substrate by a layer of thin oxide (tunneling oxide). Each of the memory cells can be electrically charged by injecting electrons from the drain region through the tunneling oxide layer onto the floating gate. The charges can be removed from the floating gate by tunneling the electrons to the substrate through the tunneling oxide layer during an erase operation. Thus the data in a memory cell is determined by the presence or absence of charges in the floating gate.

It is highly desirable to scale down write/erase voltages of flash memory, which has typically been achieved by decreasing the thickness of the tunneling oxide layer. However, conventional one-transistor flash memory has a conductive storage layer, and thus thin tunneling oxide layers will cause a significant leakage problem. Stored charges are more likely to be leaked to the substrate through a thin tunneling oxide layer than through a thick tunneling oxide layer. Particularly, if there is a defect in the tunneling oxide layer, all stored charges can potentially leak through the defect since charges can flow freely in the floating gate.

Figure 1:
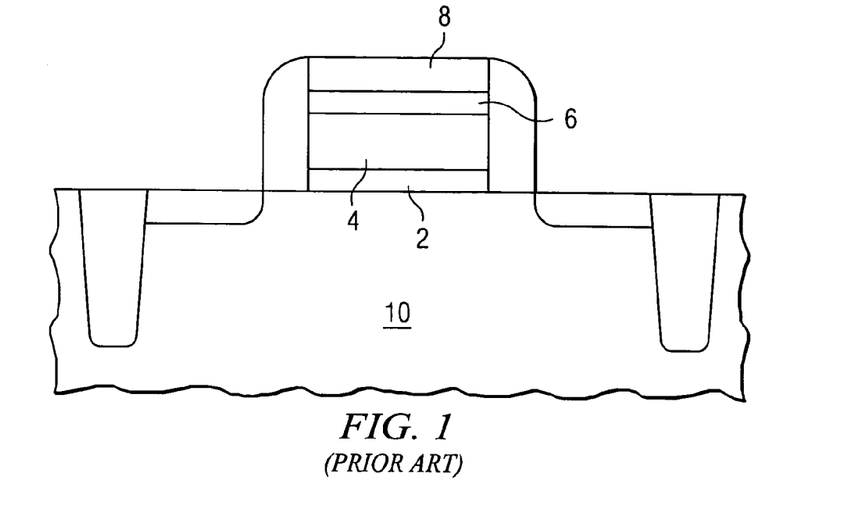
FIG. 1 illustrates a conventional floating gate flash memory cell.

One method for reducing the thickness of the tunneling oxide layer without causing severe charge loss is using a (poly-)Si—SiO$_2$—SiN—SiO$_2$—Si (SONOS) structure. FIG. 1 illustrates a SONOS flash memory cell. A tunneling oxide layer 2 is formed on a silicon substrate 10. A silicon nitride layer (floating gate) 4 is on the tunneling oxide layer 2. Silicon nitride layer 4 comprises local traps for trapping and storing charges representing digital data "1" or "0." A blocking oxide 6 is formed on the floating gate 4 to prevent charges from a possible leakage from reaching gate electrode 8, which is typically formed of polysilicon.

In SONOS memory cells, charges are stored inside the discrete and electrically isolated traps of nitride (SiN), while only the trapped charges close to the oxide defects can leak out. The good electrical isolation of stored charges is different from the conventional continuous polysilicon floating gate, which may have all stored charges leak out through a defect in the tunneling oxide layer. Therefore, it is possible to significantly scale down the thickness of the tunneling oxide layer 2, for example, to between about 2 nm and about 2.5 nm, while the charge retention ability is not noticeably compromised. In addition, with the reduction of the thickness of the tunneling oxide layer, write/erase voltages can be lowered.

The above-discussed features of SONOS memory cells make them good candidates for being integrated with CMOS logic and used for embedded system-on-chip (SoC) applications. However, further improvements are needed to simultaneously achieve low operation voltage, long data retention and fast write/erase speed in order to make them fully compatible with existing CMOS logic.

Although the SONOS memory devices provide a potential solution for down-scaling the tunneling oxide layer below conventional memory devices with a poly floating gate, it is still challenging to scale the write/erase voltage below 5 V and maintain the required ten year data retention. Additionally, the conventional SONOS memory devices using silicon nitride as storage have the disadvantage of great conduction band discontinuity ($\Delta E_C$) with a silicon channel. As a result, charge leakage is still a problem and data retention time is adversely affected. To overcome these problems, relatively thick oxides are typically needed. However, thick oxides will cause an increase in write/erase voltages.

Accordingly, what is needed in the art is a flash memory cell that may incorporate electrically isolated traps in the storage layer to take advantage of the benefits thereof while at the same time overcoming the deficiencies of the prior art.

SUMMARY OF THE INVENTION

In accordance with one aspect of the present invention, a flash memory cell includes a tunneling layer over a substrate, a storage layer over the tunneling layer, a blocking layer over the storage layer, and a gate electrode over the blocking layer. The storage layer preferably has a conduction band lower than a conduction band of silicon. The blocking layer is preferably formed of a high-k dielectric material.

In accordance with another aspect of the present invention, a flash memory cell includes a silicon substrate, a tunneling layer over the substrate, a storage layer over the tunneling layer wherein the storage layer has a conduction band lower than a conduction band of silicon, and a blocking layer over the storage layer, wherein the blocking layer has a k value of greater than about 3.9.

In accordance with yet another aspect of the present invention, a flash memory cell includes a tunneling layer over a substrate, a storage layer having a conduction band lower than a conduction band of silicon over the tunneling layer, a blocking layer over the storage layer, and a gate electrode over the blocking layer, wherein the gate electrode has a conduction band lower than a conduction band of silicon.

The advantageous features of the present invention include reduced leakage, prolonged retention time and reduced write/erase voltages.

DESCRIPTION OF THE DRAWINGS

For a more complete understanding of the present invention, and the advantages thereof, reference is now made to the following descriptions taken in conjunction with the accompanying drawings, in which:

FIGS. 2A through 6A are cross-sectional views of intermediate stages in the manufacture of a preferred embodiment of the present invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A manufacturing process of a preferred embodiment of the present invention is discussed. Variations of the preferred embodiments are provided, wherein like reference numbers are used to designate like elements throughout the various views and illustrative embodiments of the present invention. The operations of the preferred embodiments of the present invention are then discussed.

Figure 2A:
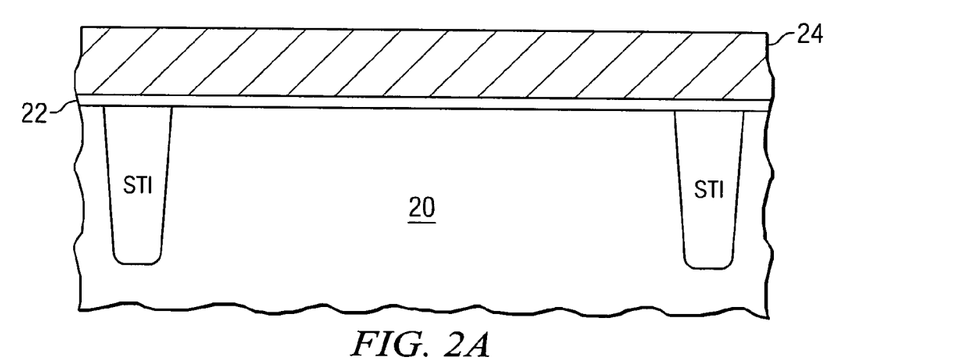
Figure 2B:
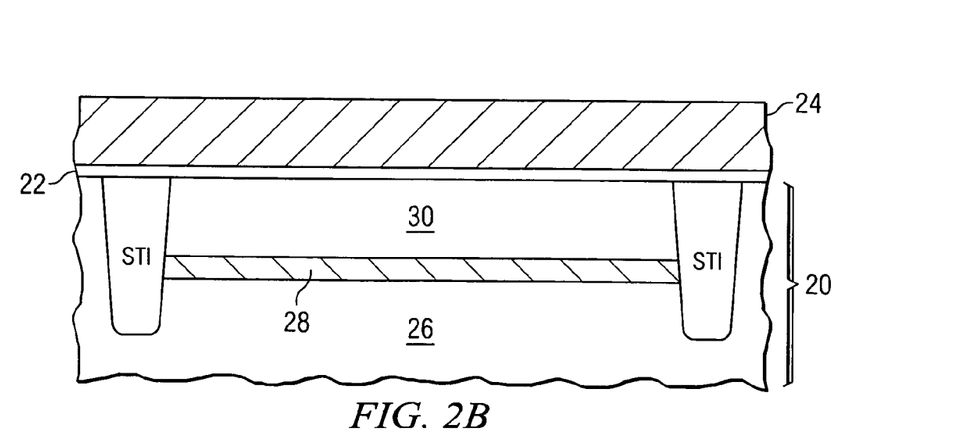

FIGS. 2A through 6A illustrate cross-sectional views of intermediate stages in the manufacture of a preferred embodiment. FIG. 2A illustrates shallow trench isolation (STI) regions formed in a substrate 20. The STI regions are preferably formed by etching shallow trenches in substrate 20 and filling the trenches with an insulator such as silicon oxide. In one embodiment, substrate 20 is formed of a bulk material such as silicon. In alternative embodiments, substrate 20 has a structure of silicon-on-insulator (SOI), as illustrated in FIG. 2B, with a semiconductor layer 30 on a buried oxide (BOX) layer 28, which is further located on a semiconductor layer 26. Semiconductor layer 30 preferably comprises silicon. In further embodiments, strained-Si on insulator (SSOI) may be used.

A tunneling layer 22 is formed on substrate 20. In one preferred embodiment, tunneling layer 22 comprises oxide, such as silicon oxide formed by thermal oxidation. In other preferred embodiments, tunneling layer 22 comprises high-k dielectric materials, such as HfAlO, $HfO_2$, $Ta_2O_5$, $ZrO_2$, and the like. An advantageous feature for using a high-k dielectric material is that a barrier height $\Phi_{B1}$ (refer to FIG. 8) between high-k dielectric materials and the underlying silicon substrate 20 is typically low. As is known in the art, there are two typical tunneling mechanisms, Fowler-Nordheim (FN) tunneling and direct tunneling. FN tunneling is typically associated with the barrier height, while direct tunneling is often associated with the thickness of the barrier layer. With a low barrier height $\Phi_{B1}$, FN tunneling of charges through the tunneling layer 22 is easier, and the write/erase voltages can be reduced. Preferably, the barrier height $\Phi_{B1}$ is less than about 3.1 eV. The thickness of the tunneling layer 22, however, is preferably increased, so that direct tunneling is reduced, and thus the possible charge-leakage is reduced. In the preferred embodiment, the k value of tunneling layer 22 is greater than about 3.9, and more preferably greater than about 9. The thickness is preferably greater than about 20 Å, and more preferably between about 30 Å and about 40 Å.

A storage layer 24 is formed on tunneling layer 22. Storage layer 24 is preferably a dielectric layer with a high trap density. In addition, the conduction band of the storage layer 24 is preferably lower than the conduction band of silicon. In the preferred embodiment, the storage layer 24 comprises aluminum nitride (AlN). AlN may be deposited using physical vapor deposition or sputter, for example, sputtering aluminum in an environment comprising nitrogen as a reactive gas. In an exemplary embodiment for forming the AlN layer 24, the reactive gas includes nitrogen having a flow rate of about 25 sccm and argon having a flow rate of about 5 sccm. In other embodiments, storage layer 24 may include other high-k dielectric materials including oxides, nitrides and oxynitrides, such as $Si_3N_4$, $Al_2O_3$, $HfO_2$, HfON, ZRON, and combinations thereof. An advantageous feature of using AlN in storage layer 24 is that its conduction band is lower than the conduction band of $Si_3N_4$, thus the band discontinuity between the storage layer 24 and silicon substrate 20 is lowered, resulting in a reduced leakage for charges stored in storage layer 24.

In more preferred embodiments, storage layer 24 further comprises Ga or GaN in addition to AlN, forming AlGaN. An advantageous feature of GaN is its negative band alignment to silicon, meaning that the conduction band of GaN is not only lower than that of $Si_3N_4$, but also lower than that of silicon. A further advantageous feature is that GaN has a high valence band, thus the resulting valence band of AlGaN is increased compared to that of AlN. The low conduction band of AlGaN results in further reduction in the leakage, and the high valence band results in the reduction of over-erase. Further details will be provided in subsequent paragraphs.

AlGaN is preferably formed using metal organic chemical vapor deposition (MOCVD) at a temperature of about 550° C. Preferably, the composition of aluminum, gallium and nitride is adjusted to achieve a desired conduction band and valence band. In an exemplary embodiment, storage layer 24 comprises between about 1 percent and about 99 percent aluminum, and between about 99 percent and about 1 percent gallium. The preferred thickness of the storage layer 24 is greater than about 10 Å, and more preferably between about 80 Å and about 100 Å.

With a dielectric storage layer 24, charges are stored in the storage layer 24 around traps, and thus two, or even four, bits can be stored in one cell (multi-level cells).

Under certain formation conditions, a dual phase structure may be formed in storage layer 24. Besides the dielectric materials (such as AlN or AlGaN) in the storage layer 24, the dual phase structure may also include nano crystal islands isolated by the dielectric materials. Such crystal islands have high charge-storage ability, sometimes comparable to the charge-storage ability of metals. The storage ability of the storage layer 24 with a dual phase structure is thus high. In an exemplary embodiment, the dual phase structure can be formed by adjusting process conditions including, for example, co-sputtering of Hf and Si in an $O_2$/Ar ambient to form HfSiO, and post deposition anneal (PDA) at 700-1000° C. for about 30 to about 60 seconds to form the dual phase structure. In another exemplary embodiment, the process conditions include a temperature of between about room temperature and about 500° C. for the co-sputtering of Hf and Si, and a post deposition anneal at about 900° C. for 30 seconds.

Figure 3:
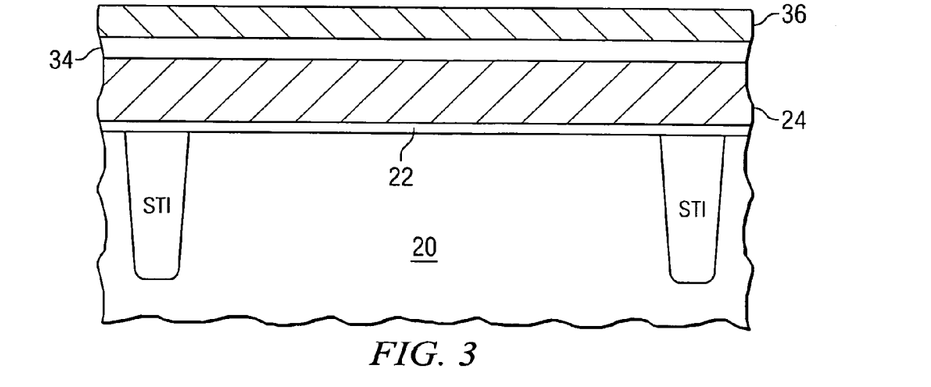

FIG. 3 illustrates the formation of a blocking layer 34 and a gate electrode layer 36. Preferably, the blocking layer 34 has a low leakage of charges. Accordingly, the blocking layer 34 preferably has a high conduction band, so that the barrier height $\Phi_{B2}$ (refer to FIG. 9), which is the difference between the conduction band of the blocking layer 34 and the conduction band of the subsequently formed gate electrode layer 36, is high. The barrier height $\Phi_{B2}$ is preferably greater than about 3.1 eV. In the preferred embodiment, blocking layer 34 comprises $AlLaO_3$, which may be formed using physical vapor deposition (PVD) of AlLa in a reactive gas comprising oxygen. In other embodiments, blocking layer 34 comprises other high-k dielectric materials, such as $HfAlO_3$, $HfO_2$, $Ta_2O_5$, $Al_2O_3$, $ZrO_2$, $TiO_2$, $SrTiO_3$, and combinations thereof. Commonly used methods such as PVD, atomic layer chemical vapor deposition (ALCVD), MOCVD, and the like can also be used. The k value of the blocking layer 34 is preferably greater than about 3.9, and more preferably greater than about 9.

Gate electrode layer 36 is preferably a metal-comprising layer having a high work function. A higher work function also helps increase the barrier height $\Phi_{B2}$ (refer to FIG. 9), thus reducing the undesirable FN tunneling through blocking layer 34, which results in leakage and the replenish of charges into storage layer 24 during the erase operations. Preferably, the work function of gate electrode layer 36 is greater than about 4.0 eV, and more preferably greater than about 4.5 eV. In an exemplary embodiment, gate electrode layer 36 comprises TaN, which has a work function of about 4.7 eV. An exemplary method for depositing a TaN layer includes sputtering or physical vapor deposition (PVD) to deposit tantalum, and the deposition conditions preferably include argon at a flow rate of 25 sccm, nitrogen at a flow rate of 5 sccm, and a DC power of about 450 W. In other embodiments, gate electrode layer 36 comprises conductive metal oxides and/or metal oxynitrides. In another exemplary embodiment, gate electrode layer 36 includes $IrO_2$, which has a work function of about 5.1 eV. $IrO_2$ is preferably deposited using sputter or PVD, and the deposition conditions include argon at a flow rate of 25 sccm, nitrogen at a flow rate of 5 sccm, and a DC power of about 450 W. In yet other embodiments, gate electrode layer 36 is a substantially pure-metal gate comprising metals such as iridium, platinum, nickel, palladium, rhodium, and combinations thereof. Similarly, the formation methods preferably include sputter and PVD.

Figure 4:
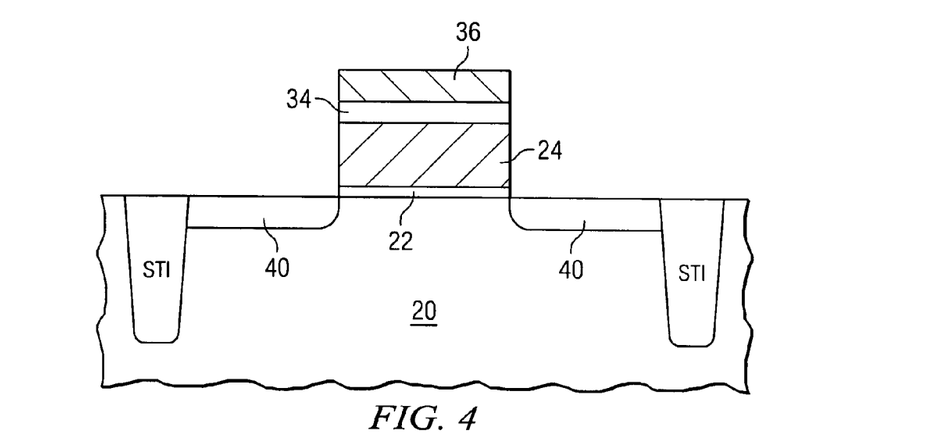

The stacked layers are then patterned, forming a gate stack as shown in FIG. 4. Lightly doped regions (LDD) 40 may then be formed, preferably by implanting an n-type impurity. The gate stack serves as a self-aligning mask so that LDD regions 40 are substantially aligned with the edges of the gate stack.

Figure 5:
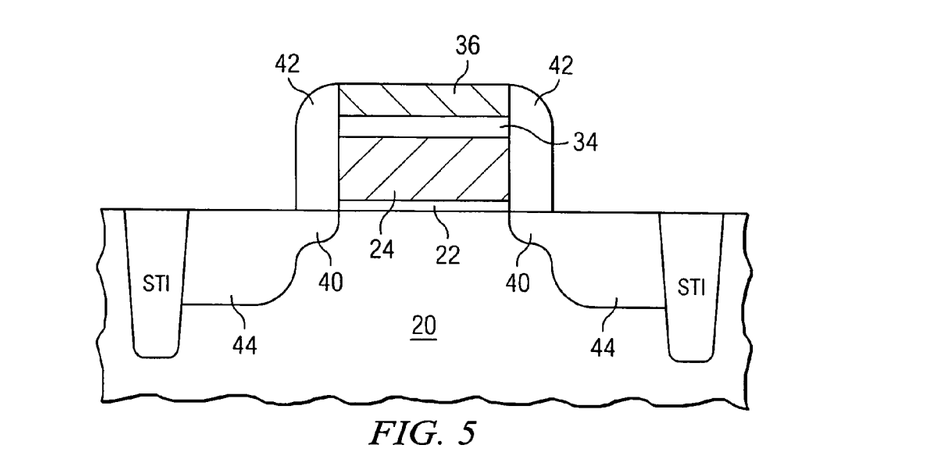

FIG. 5 illustrates the formation of spacers 42 and source/drain regions 44. Spacers 42 may be formed by well-known methods such as blanket depositing a dielectric layer over the entire region, then anisotropically etching to remove the dielectric layer from the horizontal surfaces and leaving spacers 42. Source/drain regions 44 are then formed, preferably by implanting an n-type impurity. By masking the gate stack and gate spacers 42, source/drain regions 44 are substantially aligned to the edges of the gate spacers 42.

Figure 6A:
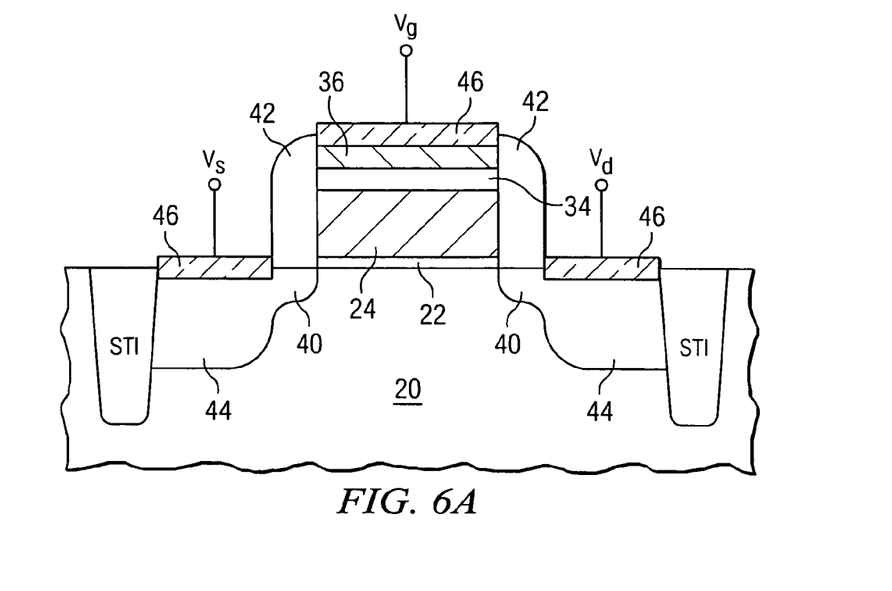

FIG. 6A illustrates the formation of silicide regions 46. To form silicide regions, a metal layer is formed by depositing a thin layer of metal, such as cobalt, nickel, erbium, molybdenum, platinum, and the like, over the device. The device is then annealed to form silicide regions between the deposited metal and the underlying exposed silicon regions. Excess metal is then removed.

Figure 6B:
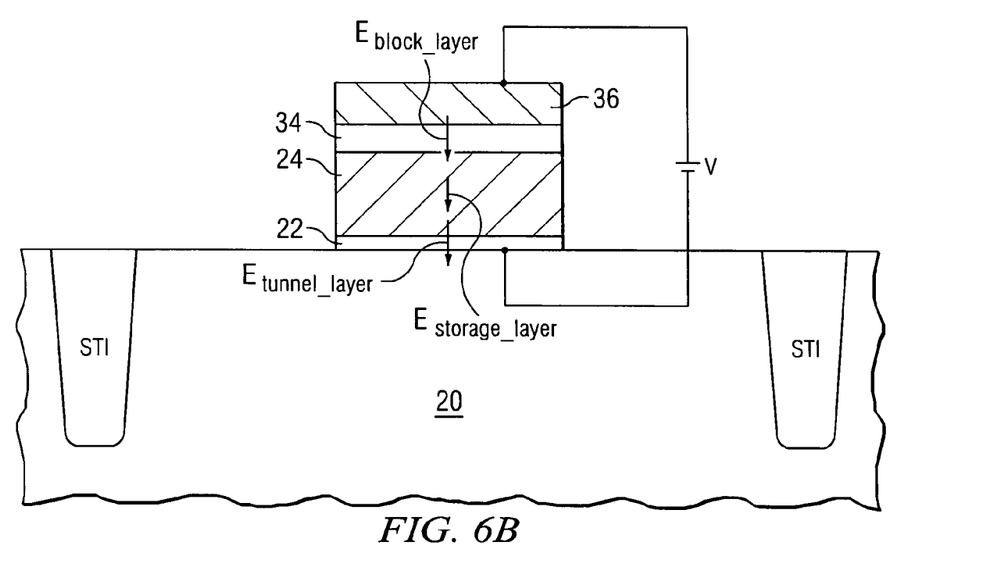
FIG. 6B schematically illustrates electric fields in the gate stack of a preferred embodiment.

In the above-discussed embodiments, blocking layer 36 preferably comprises a high-k dielectric material. An explanation of the respective advantageous features is provided as follows. During a write or erase operation, a voltage is applied between the substrate 20 and the gate electrode layer 36. Electric fields, which are schematically illustrated in FIG. 6B, are thus formed in the dielectric layers 22, 24 and 34. Assuming no free charges exist (or the number of free charges can be ignored) and a voltage V is applied between the substrate 20 and the metal gate 36, and the electric fields in layers 34, 24 and 22 are denoted as $E_{block\_layer}$, $E_{storage\_layer}$ and $E_{tunnel\_layer}$, respectively, the boundary conditions between the three media from Gauss's law requires that:

$$D = \epsilon_{block\_layer} E_{block\_layer} = \epsilon_{storage\_layer} E_{storage\_layer} = \epsilon_{tunnel\_layer} E_{tunnel\_layer} \quad [Eq. 1]$$

wherein D is the electric displacement field. $\epsilon_{block\_layer}$, $\epsilon_{storage\_layer}$ and $\epsilon_{tunnel\_layer}$ are permittivities, which are equal to the k values in blocking layer 34 multiplied by the permittivity in vacuum $\epsilon_0$, storage layer 24 and tunneling layer 22, respectively. $E_{block\_layer}$, $E_{storage\_layer}$ and $E_{tunnel\_layer}$ are electric fields in blocking layer 34, storage layer 24 and tunneling layer 22, respectively. Therefore, it is found that $\epsilon_{block\_layer}$ and $E_{block\_layer}$ are inversely related. If the $\epsilon_{block\_layer}$ is increased, $E_{block\_layer}$ will be decreased. For example, $AlLaO_3$ has a k value of between about 23 and 25, about 6 times the k value of $SiO_2$, which is about 3.9. If the blocking layer 34 includes $AlLaO_3$ instead of $SiO_2$, the electric field $E_{block\_layer}$ is significantly reduced.

The voltage drop dV in a dielectric layer having an electric field E can be expressed approximately as:

$$dV = E \cdot dS \quad [Eq. 2]$$

wherein dV is the voltage drop in the dielectric layer in a distance of dS in the direction of electric field E. Since the electric field of a high-k blocking layer is significantly lower than the electric field of a non-high-k blocking layer, the voltage drop in blocking layer 34 is significantly reduced. Also because the total voltage drop V is determined only by the voltage source, the voltage drop in tunneling layer 24 is increased accordingly, making writing and erasing more efficient. Write and erase voltages can thus be decreased.

A drawback of using a high-k dielectric material in blocking layer 34 is that the barrier height $\Phi_{B2}$ (refer to FIG. 9) may be reduced, and the FN tunneling through blocking layer 34 may be increased. As a result, leakage may increase. However, such an adverse effect is compensated for by using a high work-function metal gate 36, which brings up the barrier height $\Phi_{B2}$.

Although the preferred embodiments provide a method of forming an n-type flash memory device, one skilled in the art will realize that the teaching provided is readily available for the formation of p-type memory devices, with the types of the respective substrate, LDD regions and deep source/drain regions inverted.

Figure 7:
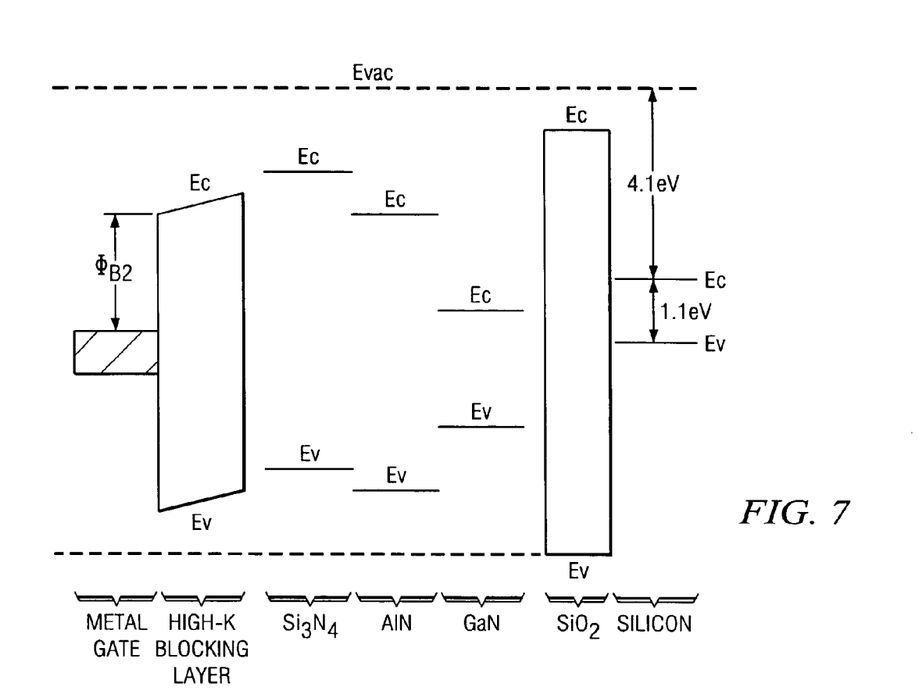
FIG. 7 illustrates a schematic band diagram of materials involved in the preferred embodiment.

FIG. 7 illustrates a schematic band diagram of a plurality of materials involved in the preferred embodiments. The band diagrams of $Si_3N_4$ and $SiO_2$ are also provided for comparison purposes. Conduction bands are denoted as $E_c$ and valence bands are denoted as $E_v$. A high band level referred to as vacuum level $E_{vac}$ is provided as a reference for the conduction bands, and the valence band of $SiO_2$ is used as a reference for the valence bands. It is noted that the conduction bands of AlN and GaN are both lower than the conduction band of $Si_3N_4$, and thus the resulting conduction band of AlGaN (not shown) will be lower than the conduction band of $Si_3N_4$. Typically, the effective conduction band of AlGaN will be between the conduction bands of AlN and GaN, and the ratio of AlN and GaN is likely to affect the resulting conduction band. Since GaN has a conduction band lower than the conduction band of silicon, by adjusting the composition of AlGaN, preferably by adding more Ga, the conduction band of AlGaN may be lower than the conduction band of silicon, resulting in a negative band alignment.

During storage of the memory devices with no bias applied, since $Si_3N_4$ has a higher conduction band than the silicon substrate, it is easier for electrons to leak from the $Si_3N_4$ storage layer 24 to the silicon substrate. On the contrary, the conduction band difference of AlGaN over the silicon substrate is low, thus electron leakage is more difficult. It is possible that the conduction band of AlGaN is even lower than that of a polysilicon substrate, making leakage of charges to the silicon substrate even more difficult. On the gate electrode side, the high work function of the gate electrode 36 results in a higher barrier height $\Phi_{B2}$, which prevents leakage through the blocking layer. Therefore, the preferred embodiments of the present invention have low leakage.

Referring back to FIG. 6A, a write operation can be performed by applying a low voltage $V_g$ to the gate and a high voltage $V_d$ to the drain (hot electron injection). Alternatively, the write operation is performed by applying a high voltage $V_g$ (and thus causing direct tunneling for a thin tunneling oxide or FN tunneling for a thick tunneling oxide) to the gate. In an exemplary embodiment, the voltage $V_g$ may be about 10V to 12V, and more preferably about 11V and even lower. The drain and source are preferably grounded.

Figure 8:
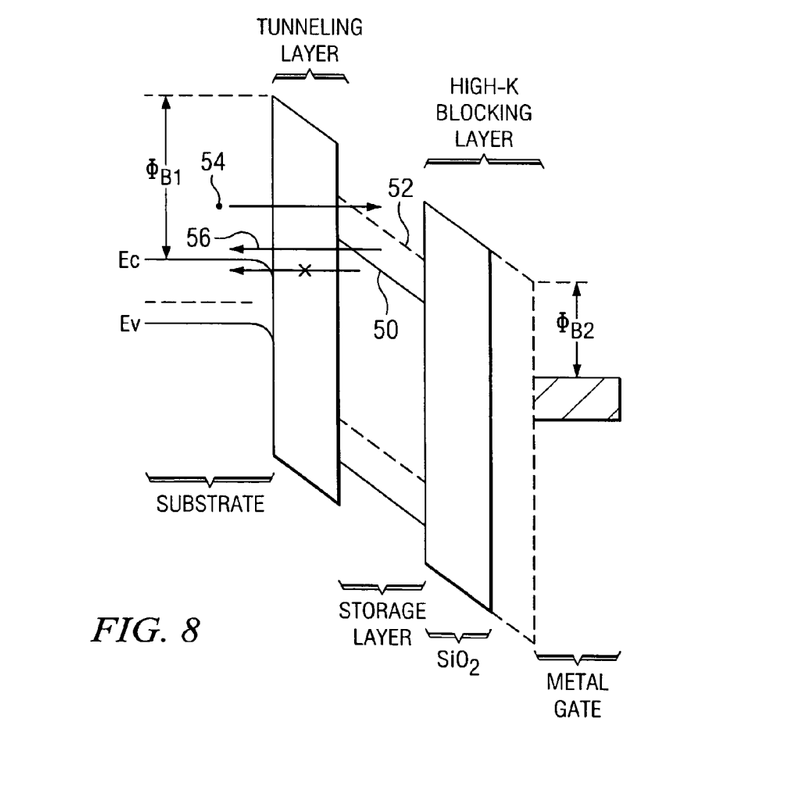
FIG. 8 illustrates a schematic band diagram in a write operation.

A band diagram of the write operation is provided in FIG. 8. For storage layer 24, conduction bands and valence bands of AlGaN and $Si_3N_4$ are both shown for comparison purposes, wherein the conduction band and valence band of AlGaN are shown as solid lines, and the conduction band and valence band of $Si_3N_4$ are shown as dotted lines. Since the conduction band 50 of AlGaN is lower than the conduction band 52 of $Si_3N_4$, deeper quantum wells can be formed in the storage layer 24. This has a two-fold advantage. Firstly, for an electron 54 in substrate 20, tunneling through the tunneling layer 22 and reaching a state in the conduction band of AlGaN is easier than reaching a low-level state in the conduction band of $Si_3N_4$, making writing easier. Secondly, an electron at a low state in the AlGaN storage layer is less likely to leak to the silicon substrate 20, wherein the leakage path is illustrated as an arrow 56. In other words, charges in deep quantum wells are more stable, thus are less likely to leak. The above-conclusions can also be made by noting that electron 54 may have to penetrate a barrier formed of tunneling layer 22 and $Si_3N_4$ if the storage layer 24 is formed of $Si_3N_4$ in order to tunnel into the storage layer 24, while the same electron 54 may only need to penetrate a tunneling layer 22 if the storage layer 24 is formed of AlGaN.

An erase operation can be performed by applying a low voltage $V_g$ to the gate and a high voltage $V_d$ (refer to FIG. 6A) to the drain (hot hole injection). Alternatively, the erase operation is performed by applying a high voltage $V_g$ (although negative) to the gate (and thus causing direct tunneling for a thin tunneling oxide or FN tunneling for a thick tunneling oxide), for example, between about −10V and −12V. The drain and source are preferably grounded.

Figure 9:
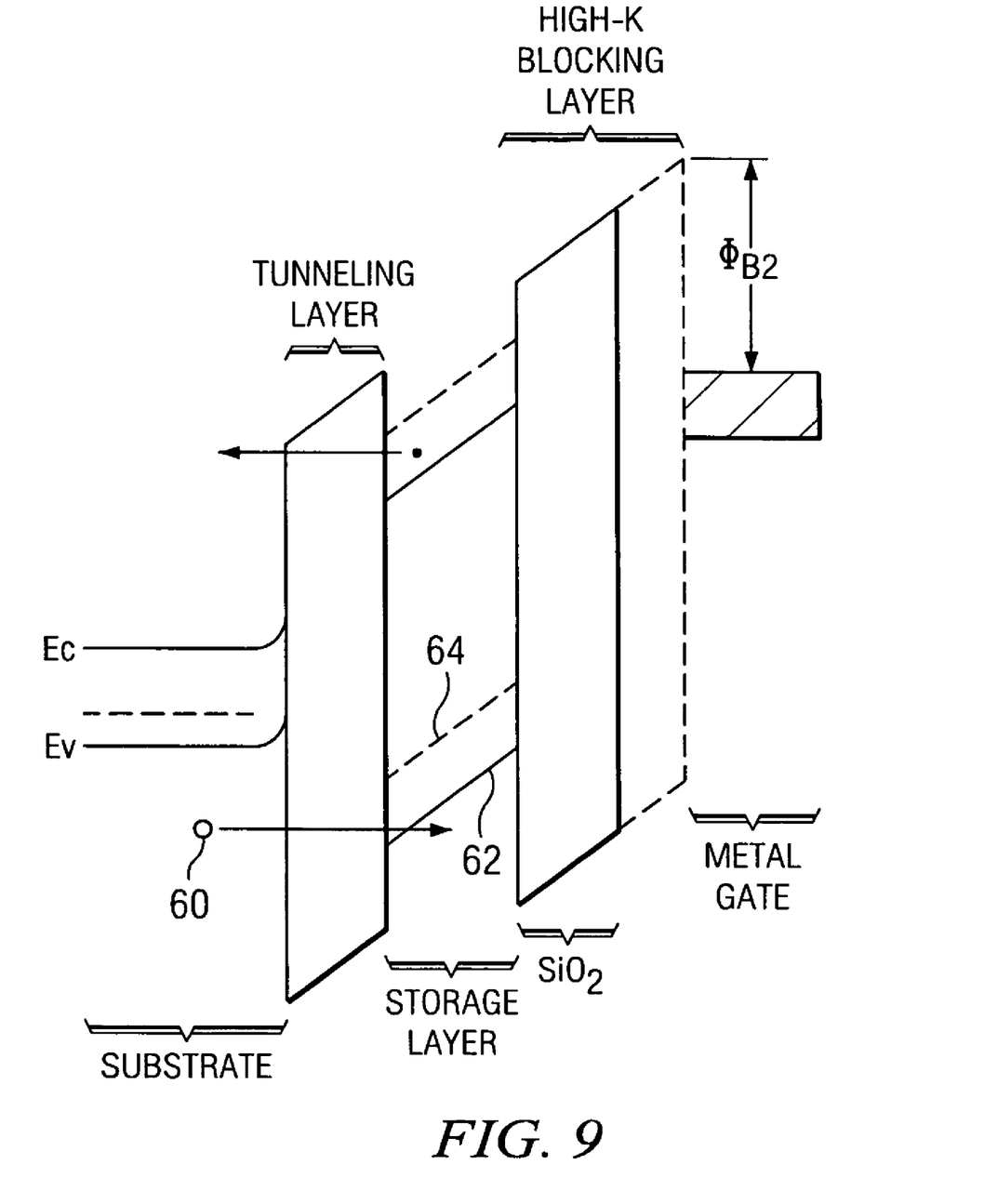
FIG. 9 illustrates a schematic band diagram in an erase operation.

A band diagram of the erase operation is provided in FIG. 9. During the erase operation, electrons tunnel out of storage layer 24 into the substrate 20 under the influence of an electric field. The electric field in blocking layer 34 may also cause electrons to tunnel through the blocking layer 34 and replenish electrons in storage layer 24. This is an undesired effect. As discussed in previous paragraphs, such an undesired effect is reduced by increasing the barrier height $\Phi_{B2}$ with a high work-function metal gate 36.

During an erase operation, holes may be injected from the silicon substrate 20 into the storage layer 24, causing over-erase. Since the valence band 62 of AlGaN is lower than the valence band 64 of $Si_3N_4$, a hole 60 is less likely to be injected into a storage layer formed of AlGaN than a storage layer formed of $Si_3N_4$.

The preferred embodiments of the present invention have several advantageous features. The leakage is low, and thus the retention time of the resulting flash memory device is long. The write/erase voltages are reduced, and may easily be provided by existing CMOS circuits. An additional advantageous feature of the present invention includes fast write/erase operations.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a tunneling layer over a substrate;
   a storage layer having a conduction band lower than a conduction band of silicon over the tunneling layer with the semiconductor device being at an un-powered state, wherein the storage layer is formed of a dielectric material and comprises AlGaN;
   a blocking layer over the storage layer; and
   a gate electrode over the blocking layer.

2. The semiconductor device of claim 1, wherein the storage layer has a dual phase structure comprising nano crystal islands.

3. The semiconductor device of claim 1, wherein the storage layer is adapted for storing two or four bits.

4. The semiconductor device of claim 1, wherein the tunneling layer comprises silicon oxide.

5. The semiconductor device of claim 1, wherein the tunneling layer comprises a high-k oxide with a dielectric constant (k value) of greater than about 3.9, and wherein a barrier height between the substrate and the tunneling layer is less than about 3.1 eV.

6. The semiconductor device of claim 1, wherein the blocking layer comprises a high-k oxide with a k value of greater than about 3.9.

7. The semiconductor device of claim 1, wherein the gate electrode has a conduction band lower than a conduction band of polysilicon.

8. The semiconductor device of claim 1, wherein the gate electrode comprises a material selected from the group consisting essentially of metal oxides, metal nitrides, metal oxynitrides, metals, and combinations thereof.

9. A semiconductor device comprising:
   a silicon substrate;
   a tunneling layer over the substrate;
   a storage layer over the tunneling layer, wherein the storage layer has a conduction band lower than a conduction band of silicon with the semiconductor device being at an un-powered state, and wherein the storage layer comprises AlGaN; and a blocking layer over the storage layer, wherein the blocking layer has a k value of greater than about 3.9.

10. The semiconductor device of claim 9, wherein the blocking layer comprises high-k dielectric materials selected from the group consisting essentially of $HfO_2$, $Ta_2O_5$, $Al_2O_3$, $ZrO_2$, $TiO_2$, $SrTiO_3$, and combinations thereof.

11. The semiconductor device of claim 9 further comprising a gate electrode over the blocking layer, wherein the gate electrode comprises a material selected from the group consisting essentially of metal oxides, metal nitrides, metal oxynitrides, and combinations thereof.

12. The semiconductor device of claim 9, wherein the gate electrode is a substantially pure metal gate comprising materials selected from the group consisting essentially of iridium, platinum, nickel, palladium, rhodium, $IrO_2$, TaN, TiN, and combinations thereof.

13. The semiconductor device of claim 9, wherein the blocking layer comprises a material selected from the group consisting essentially of $AlLaO_3$, $ZrAlO_x$, $HfAlO_x$, $HfO_2$, $Ta_2O_5$, $Al_2O_3$, $ZrO_2$, $TiO_2$, $SrTiO_3$, and combinations thereof.

* * * * *